(12) United States Patent
Chen et al.

(10) Patent No.: US 7,157,293 B2
(45) Date of Patent: Jan. 2, 2007

(54) METHOD FOR MAKING A SEMICONDUCTOR LIGHT EMITTING DEVICE

(75) Inventors: Cheng-Chuan Chen, Tainan Hsien (TW); Kun-Yu Lai, Tainan Hsien (TW)

(73) Assignee: Genesis Photonics Inc., Tainan Hsien (TW)

( * ) Notice: Subject to any disclaimer, the term of this patent is extended or adjusted under 35 U.S.C. 154(b) by 109 days.

(21) Appl. No.: 11/062,490

(22) Filed: Feb. 23, 2005

(65) Prior Publication Data
US 2006/0094139 A1 May 4, 2006

(30) Foreign Application Priority Data
Oct. 21, 2004 (TW) ............................... 93131968 A (51) Int. Cl.
*H01L 21/00* (2006.01)
(52) U.S. Cl. ........................... 438/22; 438/30; 438/907
(58) Field of Classification Search .................. 438/22, 438/30, 33, 907, 964
See application file for complete search history.

(56) References Cited

U.S. PATENT DOCUMENTS

2002/0032531 A1* 3/2002 Mansky et al. ............... 702/21

* cited by examiner

*Primary Examiner*—Phuc T. Dang
(74) *Attorney, Agent, or Firm*—Foley & Lardner LLP (57) ABSTRACT

A method for making a semiconductor light emitting device comprises the steps of: (a) forming a plurality of buttresses on a first supporting substrate such that the buttresses are separated by a plurality of intercommunicated spaces theramong; (b) forming a base layer on top end portions of the buttresses in such a manner that the top end portions of the buttresses are enclosed in the base layer; (c) forming a multi-layered light-emitting structure on the base layer; (d) attaching a second supporting substrate to the light-emitting structure; and (e) separating the first supporting substrate from the light-emitting structure by destroying the buttresses.

24 Claims, 10 Drawing Sheets

METHOD FOR MAKING A SEMICONDUCTOR LIGHT EMITTING DEVICE

CROSS-REFERENCE TO RELATED APPLICATION

This application claims priority of Taiwanese Application No. 093131968, filed on Oct. 21, 2004.

BACKGROUND OF THE INVENTION

1. Field of the Invention

This invention relates to a method for making a semiconductor light emitting device, more particularly to a method involving the formation and removal of buttresses and a base layer from a first supporting substrate so as to transfer a light-emitting structure from the first supporting substrate to a second supporting substrate.

2. Description of the Related Art

Since SiC or sapphire has a lattice constant similar to gallium nitride-based material, conventional gallium nitride-based light emitting diodes normally use silicon nitride (SiC) or sapphire ($\alpha$-Al$_2$O$_3$) as a substrate for deposition of a gallium nitride-based light emitting layer thereon. However, since SiC can absorb light, the light extraction efficiency of the conventional light emitting diodes is considerably reduced when SiC is used as the substrate. In addition, since sapphire has a refractive index smaller than that of nitride-based compound and greater than that of air, total internal reflection can occur within the light emitting diode when sapphire is used as the substrate. This has an adverse effect on the light extraction efficiency.

Figure 1:
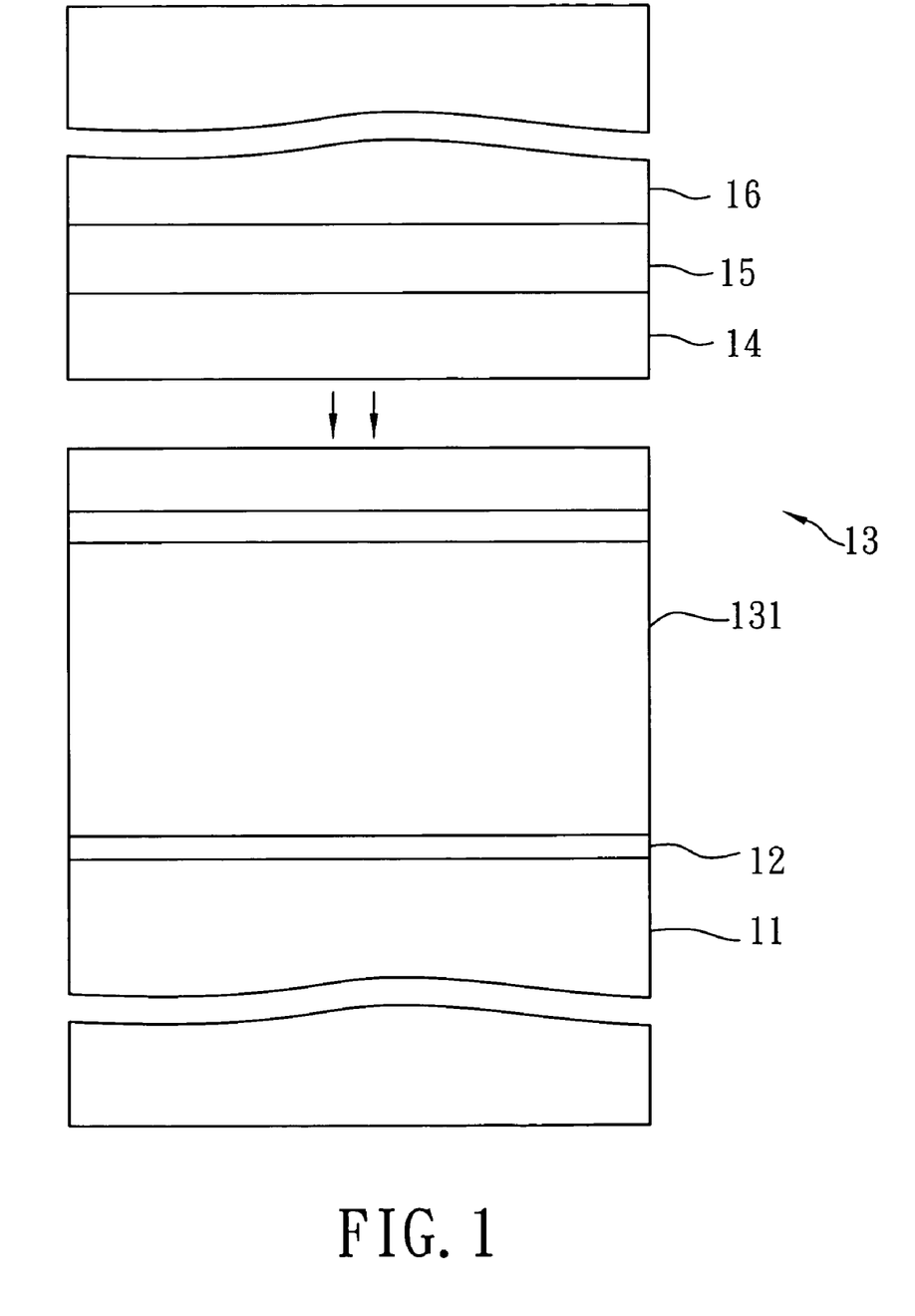
FIGS. 1 and 2 are schematic views to illustrate how a light emitting structure of a light emitting diode is transferred from a first supporting substrate to a second supporting substrate according to the conventional method.

FIG. 1 illustrates how a conventional gallium nitride-based light emitting diode is formed. The conventional light emitting diode is formed by depositing a lift-off layer 12 on a first supporting substrate 11 that is made from SiC, a multi-layered light-emitting structure 13 on the lift-off layer 12, and a metal reflective layer 14 on the light-emitting structure 13, attaching a second supporting substrate 16, which is made from Si, to the metal reflective layer 14 through an adhesive 15, and subsequently separating the light-emitting structure 13 from the first supporting substrate 11 (see FIG. 2) by applying a laser beam to the lift-off layer 12. First and second electrodes 181, 182 are formed respectively on the second supporting substrate 16 and a cladding layer 131 of the light-emitting structure 13.

Figure 2:
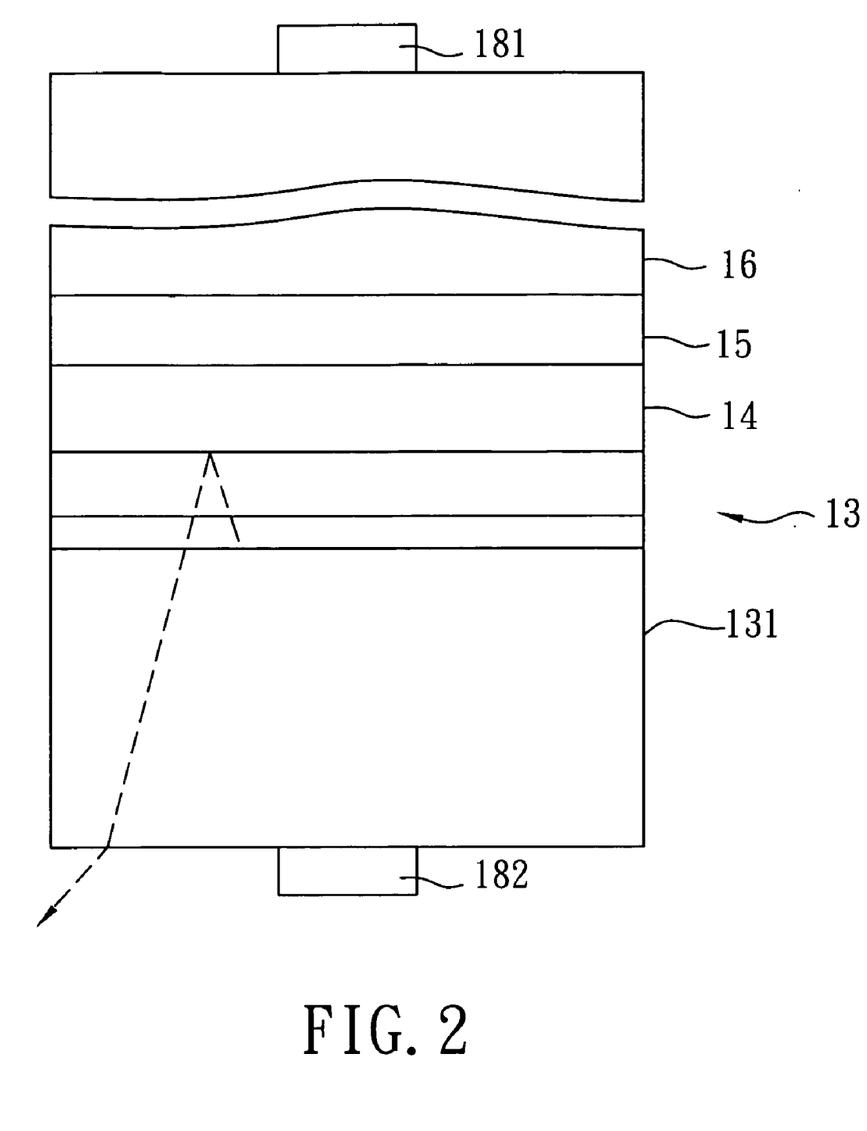

By transferring the light-emitting structure 13 from the first supporting substrate 11, which is made from SiC or sapphire, to the second supporting substrate 16, which is made from Si, the aforesaid drawback regarding reduction of light extraction efficiency can be overcome. In addition, the removed first supporting substrate 11 can be reused. However, by virtue of the structure of the lift-off layer 12, removal of the lift-off layer 12 using a laser beam is difficult and may result in damage to the light-emitting structure 13, thereby adversely effecting the production yield of the light emitting diode.

SUMMARY OF THE INVENTION

Therefore, the object of the present invention is to provide a method that involves formation of buttresses, which are easier to be remove using laser techniques than the lift-off layer of the conventional emitting diode, on the first supporting substrate of the light-emitting diode.

According to the present invention, there is provided a method for making a semiconductor light emitting device. The method comprises the steps of: (a) forming a plurality of buttresses on a first supporting substrate such that the buttresses are separated by a plurality of intercommunicated spaces thereamong; (b) forming a base layer on top end portions of the buttresses in such a manner that the top end portions of the buttresses are enclosed in the base layer; (c) forming a multi-layered light-emitting structure on the base layer; (d) attaching a second supporting substrate to the light-emitting structure; and (e) separating the first supporting substrate from the light-emitting structure by destroying the buttresses.

BRIEF DESCRIPTION OF THE DRAWINGS

In drawings which illustrate an embodiment of the invention.

DETAILED DESCRIPTION OF THE PREFERRED EMBODIMENT

Figure 3:
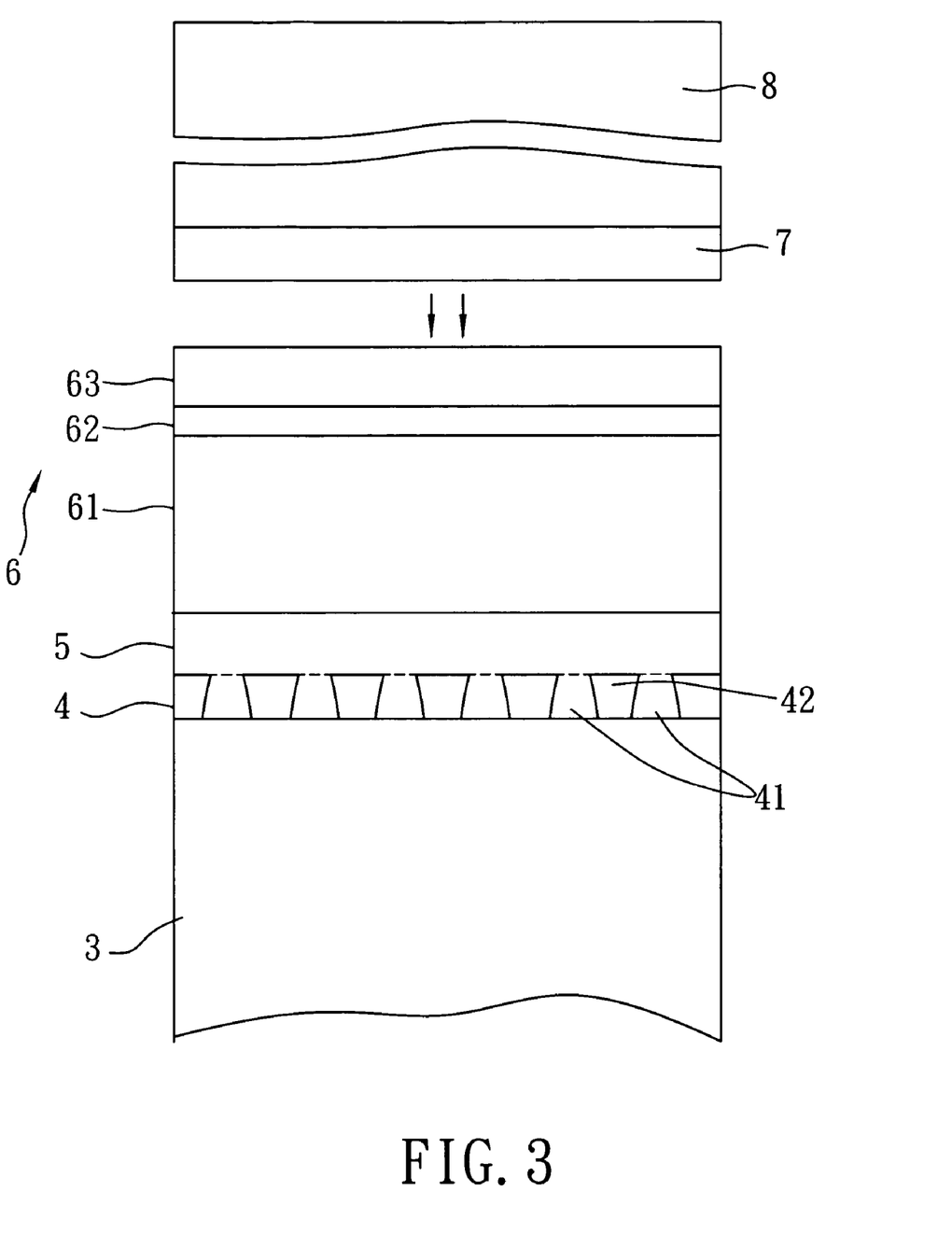
FIGS. 3 to 5 are schematic views to illustrate consecutive steps of a method of the preferred embodiment according to this invention for making a light emitting device.
Figure 4:
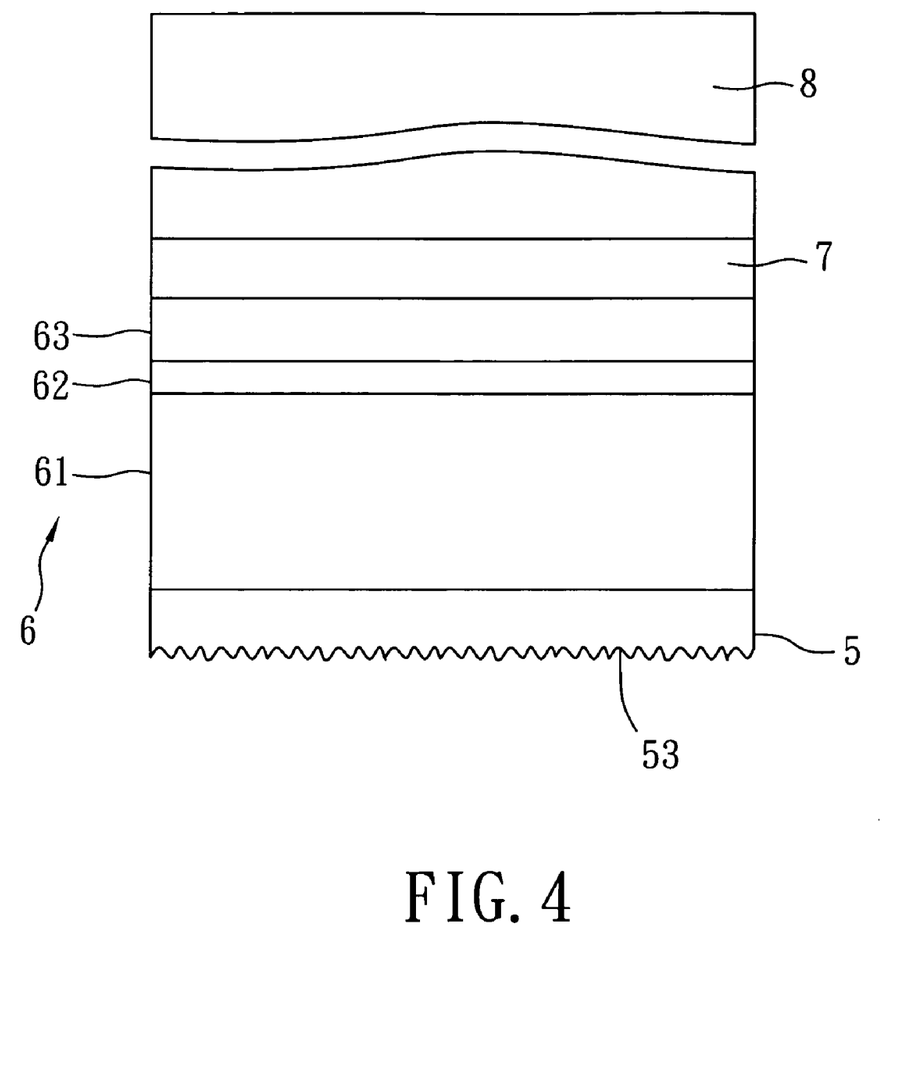
Figure 5:
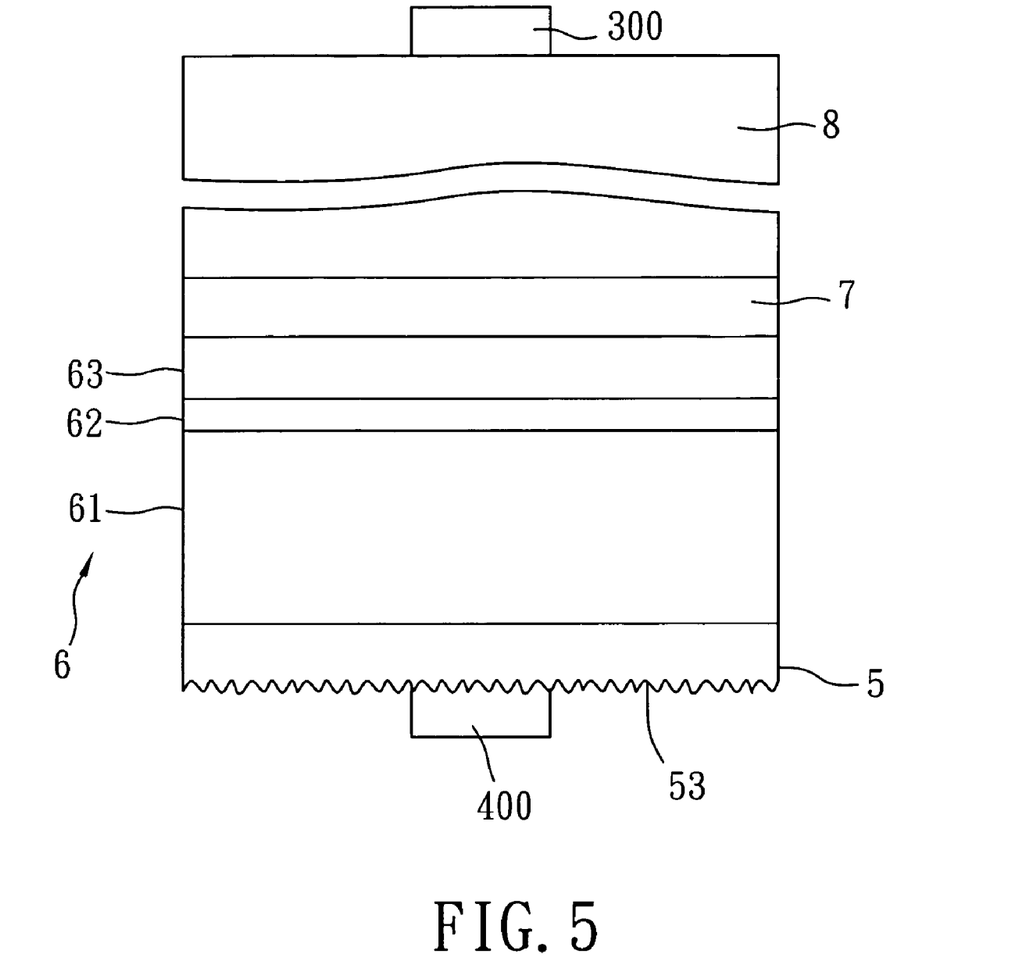
Figure 7:
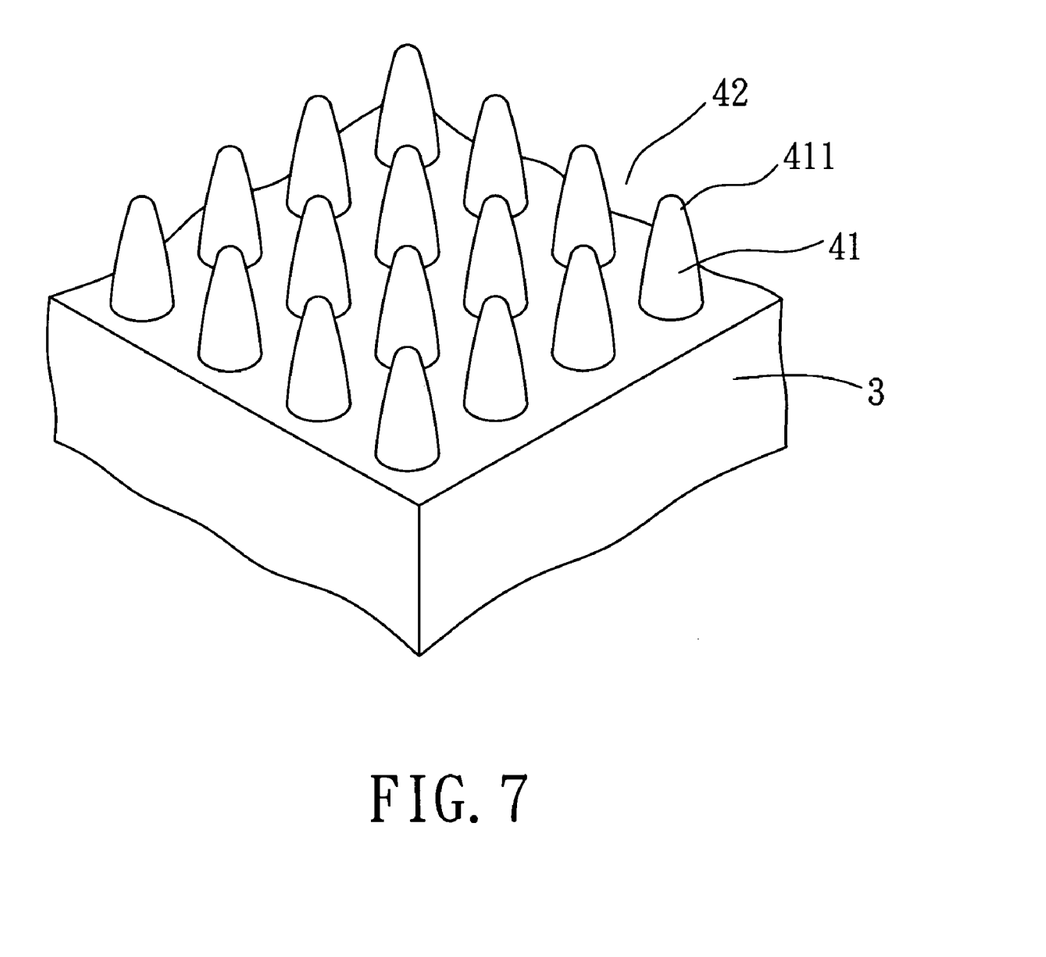
FIG. 7 is a fragmentary perspective view to illustrate the configuration of buttresses of the light emitting device of this invention.
Figure 8:
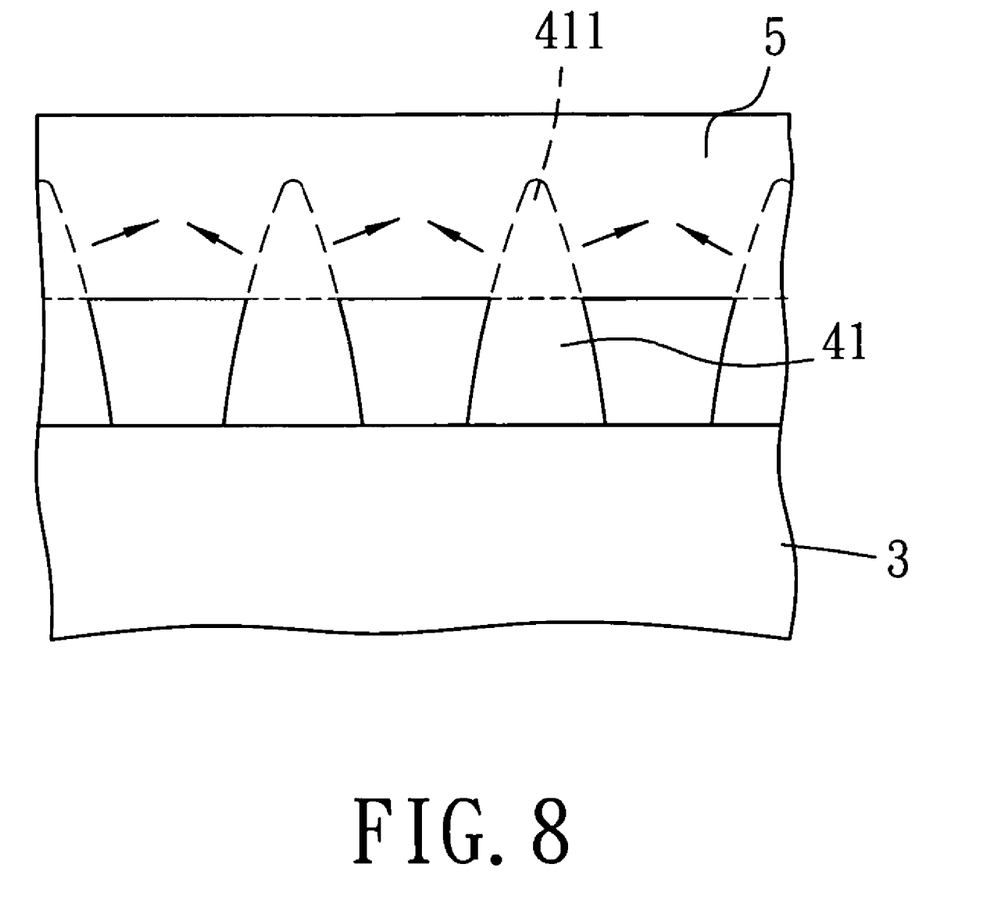
FIG. 8 is a fragmentary schematic view to illustrate how a base layer is formed on the buttresses of the light emitting device according to the preferred embodiment of this invention.

FIGS. 3 to 5 illustrate consecutive steps of a method of the preferred embodiment according to this invention for making a semiconductor light emitting device. The method includes the steps of: (a) forming a plurality of buttresses 41 on a first supporting substrate 3 (see FIGS. 3, 7, and 8) such that the buttresses 41 are separated by a plurality of intercommunicated spaces 42 thereamong; (b) forming a base layer 5 on top end portions 411 of the buttresses 41 in such a manner that the top end portions 411 of the buttresses 41 are enclosed in the base layer 3; (c) forming a multi-layered light-emitting structure 6 on the base layer 3; (d) attaching a second supporting substrate 8 to the light-emitting structure 6 through an adhesive 7; and (e) separating the first supporting substrate 3 from the light-emitting structure 6 by destroying the buttresses 41.

Figure 9:
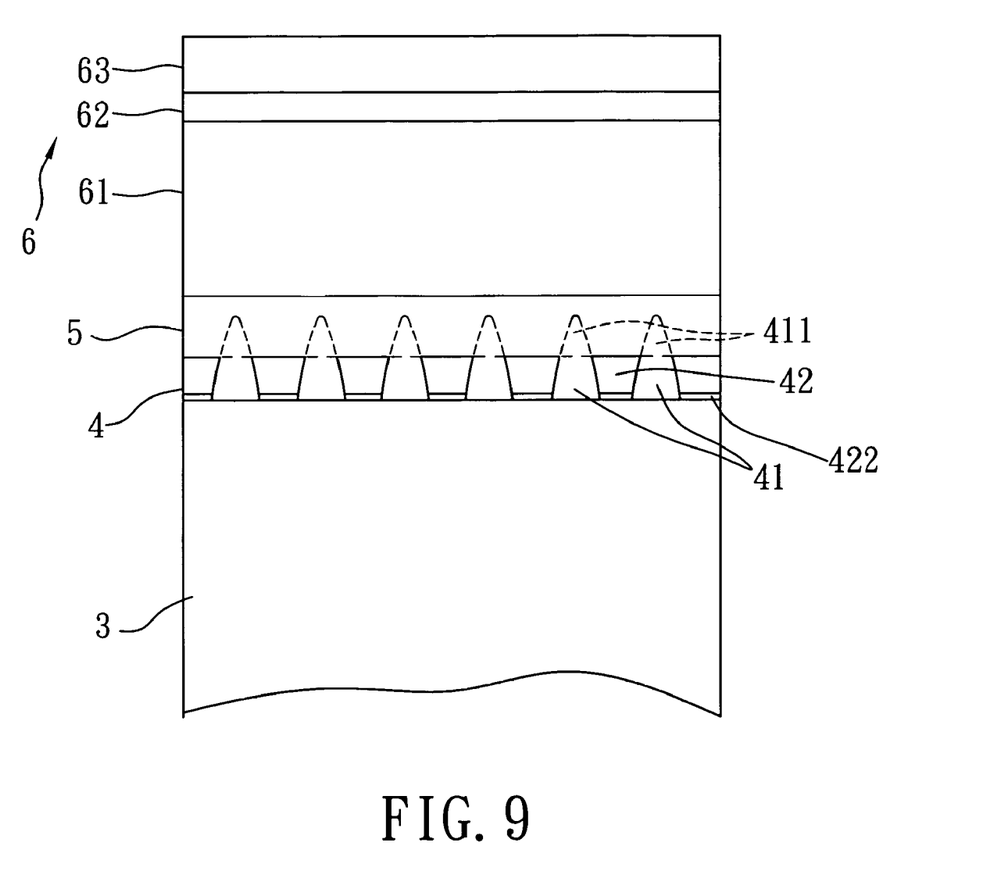
FIG. 9 is a fragmentary schematic view to illustrate how the base layer can be formed on the buttresses with the assist of an inhibiting layer according to the preferred embodiment of this invention.

In order to prevent formation of the base layer 5 on the first supporting substrate 3, an inhibiting layer 422 (see FIG. 9), which has a lattice constant that mismatches with that of the base layer 5, is preferably formed on the first supporting substrate 3 after step (a) and prior to step (b) so as to ensure lateral growth (indicated as the arrows in FIG. 8) of the base layer 5 on the top end portions 411 of the buttresses 41 and so as to ensure formation of the intercommunicated spaces 42. The inhibiting layer 422 thus formed has a height relative to the first supporting substrate 3 less than that of the buttresses 41, and is disposed below the top end portions 411 of the buttresses 41.

Preferably, a portion of the base layer 5 is removed during destroying of the buttresses 41 in step (e) so as to form a rough surface 53 on the base layer 5.

Destroying of the buttresses 41 and removable of the portion of the base layer 5 is preferably conducted using wet etching techniques or laser techniques. The intercommunicated spaces 42 among the buttresses 41 permit an etching solution, such as HCl, $H_3PO_4$, and mixtures of HCl and $HNO_3$, to penetrate therethrough, thereby facilitating wet etching of the buttresses 41.

Figure 6:
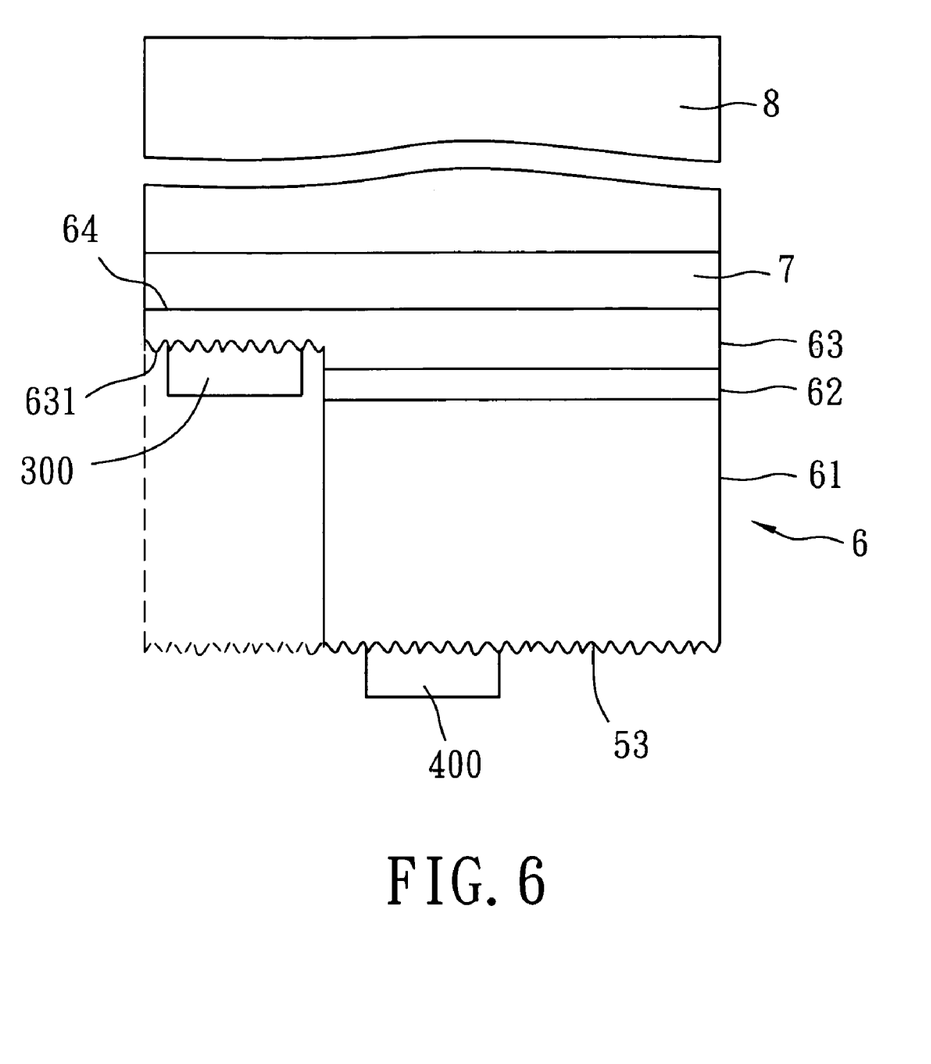
FIG. 6 is a schematic view to illustrate how an electrode is formed on a light-emitting structure of the light emitting device according to the preferred embodiment of this invention.

The semiconductor light emitting device further includes first and second electrodes 300, 400. When the second supporting substrate 8 and the base layer 5 are made from conductive materials, such as Si, GaAs, or copper, the first and second electrodes 300, 400 can be directly formed on the second supporting substrate 8 and the rough surface 53 of the base layer 5, respectively (see FIG. 5). When the second supporting substrate 8 and the base layer 5 are made from non-conductive materials, such as ZnO or sapphire, a contact portion 631 of the second cladding layer 63 (see FIG. 6) is exposed using etching techniques, and the first and second electrodes 300, 400 are formed on the contact portion 631 of the second cladding layer 63 and the rough surface 53 of the base layer 5, respectively.

The adhesive 7 can be made from an Au/Sn or Pd/In conductive adhesive when the second supporting substrate 8 is made from a conductive material, and can be made from epoxy when the second supporting substrate 8 is made from a non-conductive material.

Preferably, the buttresses 41 are made from $Al_xIn_yGa_{1-x-y}N$, where $x \geq 0$, $y \geq 0$, $1-x-y>0$, the base layer 5 is made from a gallium nitride-based material, and the inhibiting layer 422 is made from a material selected from the group consisting of silicon nitride, magnesium nitride, and silicon oxide.

Preferably, the first supporting substrate 3 is made from a material selected from the group consisting of SiC, sapphire, ZnO, aluminum nitride, and Si.

Preferably, the buttresses 41 have a height (h) relative to the first supporting substrate 3 greater than 10 nm and less than 2000 nm. Two adjacent ones of the buttresses 41 are preferably spaced apart from each other by a distance ranging from 10 to 3000 nm, and more preferably ranging from 50 to 1500 nm. Preferably, each of the buttresses 41 is generally truncated conical in shape, and has a cross-section ranging from 10 to 3000 nm, and more preferably ranging from 50 to 1500 nm.

The light-emitting structure 6 includes a first cladding layer 61 formed on the base layer 5, a light-emitting layer 62 formed on the first cladding layer 61 and formed from a gallium nitride-based semiconductor, and a second cladding layer 63 formed on the light-emitting layer 62. The first and second cladding layers 61, 63 include opposite types of majority carriers. Preferably, the first cladding layer 61 is made from a n-type GaN semiconductor, while the second cladding layer 63 is made from a p-type GaN semiconductor. The light-emitting layer 62 is an active layer of a multi-quantum well structure, and is preferably made from AlInGaN.

Figure 10:
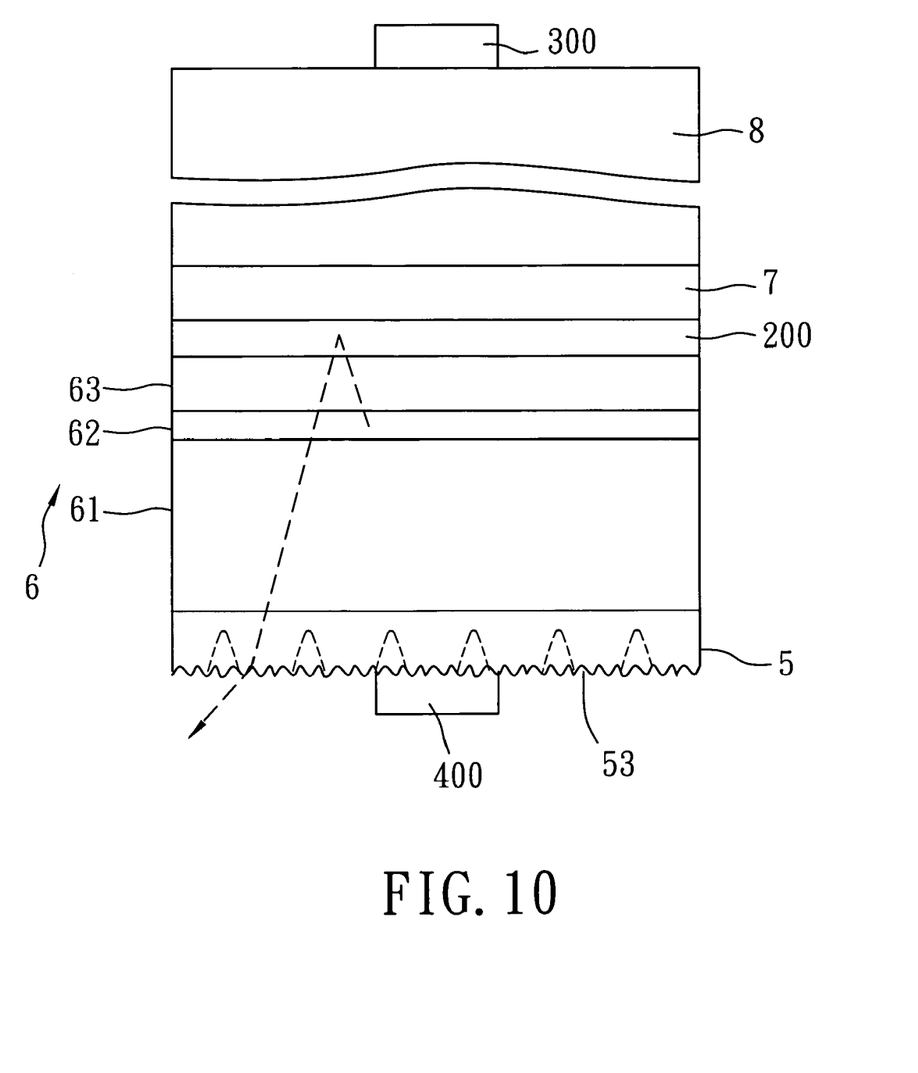
FIG. 10 is a fragmentary schematic view to illustrate how a metal reflective layer is formed according to the preferred embodiment.

Preferably, a metal reflective layer 200 (see FIG. 10) is formed on the light-emitting structure 6 after step (c) and prior to step (d), and is made from Ag or Au so as to reflect the light generated from the light-emitting structure 6 toward the rough surface 53 of the base layer 5.

In this embodiment, formation of the buttresses 41 on the first supporting substrate 3 is conducted by first forming islands (not shown) of a GaN-based semiconductor material on the first supporting substrate 3 at an operation temperature ranging from 400 to 1200° C. under a low partial pressure of $NH_3$ using metal-organic chemical vapor deposition techniques, and subsequently controlling the operation temperature to greater than 950° C. so as to permit growth of the islands into the buttresses 41. Alternatively, formation of the buttresses 41 can be conducted by controlling the amount of a low partial pressure of $NH_3$ in a deposition chamber (not shown) at an operation temperature ranging from 400 to 1200° C.

Formation of the base layer 5 on the top end portions of the buttresses 41 is preferably conducted using metal-organic chemical vapor deposition techniques by introducing a gallium-containing organic metal gas into the deposition chamber at a temperature ranging from 900 to 1200° C.

The invention is further described in the following Examples.

EXAMPLE 1

Referring back to FIGS. 3 to 8, the light emitting device of Example 1 was prepared by the following steps:

(1) placing the first supporting substrate 3, which is made from sapphire, in a vapor deposition chamber (not shown), and introducing hydrogen gas as a carrier gas into the chamber;

(2) raising the chamber temperature to about 1100° C. to heat-treat the first supporting substrate 3;

(3) growing the buttresses 41 on the first supporting substrate 3 by introducing 50 sccm of tri-methyl gallium (TMGa) gas into the deposition chamber and by setting the chamber temperature within a range of 400 to 1200° C. under a $NH_3$ partial pressure of about 20 slm;

(4) forming the base layer 5 on the top end portions of the buttresses 41 by controlling the chamber temperature to below 1000° C. and by continuous introduction of 50 sccm of TMGa gas into the deposition chamber until the thickness of the base layer 5 reaches 3 μm;

(5) introducing $SiH_4$ gas as n-doped material into the deposition chamber so as to form the first cladding layer 61 on the base layer 5 until the thickness of the first cladding layer 61 reaches 2 μm;

(6) terminating the introduction of TMGa, $SiH_4$, and $H_2$ gases into the deposition chamber and introducing $N_2$ as the carrier gas into the deposition chamber;

(7) maintaining the chamber temperature at about 750° C. and forming the light-emitting layer 62 on the first cladding layer 61 by (i) forming a first GaN barrier layer (not shown), which has a layer thickness of about 200 Å, on the first cladding layer 61, (ii) forming an InGaN confining layer (not shown) on the first GaN barrier layer, (iii) forming a second GaN barrier layer (not shown), which has a layer thickness of about 200 Å, on the InGaN confining layer, and repeating the steps from (i) to (iii) so as to form a multi-welled structure;

(8) raising the chamber temperature to 900° C. and forming the second cladding layer 63 on the light-emitting layer 62 by switching the carrier gas to hydrogen gas and introducing TMGa and Cp$_2$Mg gases into the chamber until the second cladding layer 63 reaches a layer thickness of about 1500 Å;

(9) coating the adhesive 7, which is made from epoxy, on the second cladding layer 63 and attaching the second supporting substrate 8, which is made from Si, to the second cladding layer 63 using thermal pressing techniques;

(10) placing the assembly formed from step (9) into the etching solution, which is a mixture of HCl and H$_2$NO$_3$, for about 20 minutes so as to remove the buttresses 41 therefrom and so as to form the rough surface 53 of the base layer 5; and (11) forming the first and second electrodes 300, 400 on the second supporting substrate 8 and the rough surface 53 of the base layer 5, respectively, using metal vapor deposition techniques.

EXAMPLE 2

The light emitting device of Example 2 differs from Example 1 in that it further includes the inhibiting layer 422 which is formed on the first supporting substrate 3, which is made from SiN, and which has a layer thickness greater than 1 Å. The inhibiting layer 422 was formed by introducing 40 sccm of SiH$_4$ gas into the deposition chamber after step (3), i.e., after the formation of the buttresses 41, and before step (4), i.e., prior to the formation of the base layer 5, in Example 1. Note that the buttresses 41 were also covered with the inhibiting layer 422 during the formation of the inhibiting layer 422.

EXAMPLE 3

The light emitting device of this Example differs from Example 1 in that the second supporting substrate 8 is made from sapphire and that the second cladding layer 63 is further processed using dry etching techniques so as to expose a contact region thereof, i.e., the contact portion 631 of the cladding layer 63, for deposition of the first electrode 300 thereon.

Since the buttresses 41 of the light emitting device of this invention can be removed more easily than the lift-off layer of the conventional light emitting device using laser techniques, the aforesaid drawback associated with the prior art can be eliminated. Moreover, the buttresses 41 can also be easily removed using wet etching techniques by virtue of the intercommunicated spaces 42. Furthermore, wet etching of the buttresses 41 is advantageous in that it results in the formation of the rough surface 531 of the base layer 5 which can enhance the light extraction efficiency of the light emitting device.

With the invention thus explained, it is apparent that various modifications and variations can be made without departing from the spirit of the present invention.

We claim:

1. A method for making a semiconductor light emitting device comprising the steps of:
   (a) forming a plurality of buttresses on a first supporting substrate such that the buttresses are separated by a plurality of intercommunicated spaces thereamong;
   (b) forming a base layer on top end portions of the buttresses;
   (c) forming a multi-layered light-emitting structure on the base layer;
   (d) attaching a second supporting substrate to the light-emitting structure; and
   (e) separating the first supporting substrate from the light-emitting structure by destroying the buttresses.

2. The method of claim 1, further comprising forming an inhibiting layer on the first supporting substrate after step (a) and prior to step (b) in such a manner that the inhibiting layer has a height relative to the first supporting substrate less than that of the buttresses, is disposed below the top end portions of the buttresses, and is made from a material with a lattice constant mismatched with that of the base layer.

3. The method of claim 1, further comprising removing a portion of the base layer during destroying of the buttresses in step (e) so as to form a rough surface on the base layer.

4. The method of claim 3, wherein destroying of the buttresses and removing of the portion of the base layer is conducted using wet etching techniques.

5. The method of claim 2, wherein the second supporting substrate and the base layer are conductive, the method further comprising forming first and second electrodes on the second supporting substrate and the rough surface of the base layer, respectively.

6. The method of claim 1, wherein the light-emitting structure includes a first cladding layer formed on the base layer, the method further comprising removing the base layer and a portion of the first cladding layer during destroying of the buttresses in step (e) so as to form a rough surface on the first cladding layer.

7. The method of claim 6, wherein the second supporting substrate is conductive, the method further comprising forming first and second electrodes on the second supporting substrate and the rough surface of the first cladding layer, respectively.

8. The method of claim 1, wherein destroying of the buttresses in step (e) is conducted by applying a laser beam to the buttresses.

9. The method of claim 2, wherein the buttresses are made from Al$_x$In$_y$Ga$_{1-x-y}$N, in which x$\geq$0, y$\geq$0, 1−x−y>0.

10. The method of claim 9, wherein the base layer is made from a gallium nitride-based material, and the inhibiting layer is made from a material selected from the group consisting of silicon nitride, magnesium nitride, and silicon oxide.

11. The method of claim 1, wherein the buttresses have a height relative to the first supporting substrate greater than 10 nm and less than 2000 nm.

12. The method of claim 1, wherein two adjacent ones of the buttresses are spaced apart from each other by a distance ranging from 10 to 3000 nm.

13. The method of claim 1, wherein two adjacent ones of the buttresses are spaced apart from each other by a distance ranging from 50 to 1500 nm.

14. The method of claim 1, wherein each of the buttresses is generally truncated conical in shape, and has a cross-section ranging from 10 to 3000 nm.

15. The method of claim 1, wherein each of the buttresses is generally truncated conical in shape, and has a cross-section ranging from 50 to 1500 nm.

16. The method of claim 1, wherein the first supporting substrate is made from a material selected from the group consisting of SiC, sapphire, ZnO, aluminum nitride, and Si.

17. The method of claim 1, wherein the light-emitting structure includes a first cladding layer formed on the base layer, a light-emitting layer formed on the first cladding layer and formed from a gallium nitride-based semiconductor, and a second cladding layer formed on the light-emitting layer, the first and second cladding layers including opposite types of majority carriers.

18. The method of claim 1, further comprising forming a metal reflective layer on the light-emitting structure after step (c) and prior to step (d).

19. The method of claim 2, wherein formation of the buttresses on the first supporting substrate is conducted by first forming islands of a GaN-based semiconductor material on the first supporting substrate at an operation temperature ranging from 400 to 1200° C. using metal-organic chemical vapor deposition techniques, and subsequently controlling the operation temperature to greater than 900° C. so as to permit growth of the islands into the buttresses.

20. The method of claim 19, wherein formation of the base layer on the top end portions of the buttresses is conducted using metal-organic chemical vapor deposition techniques at a temperature ranging from 900 to 1200° C.

21. The method of claim 1, wherein formation of the buttresses on the first supporting substrate is conducted by first forming islands of a GaN-based semiconductor material on the first supporting substrate at an operation temperature ranging from 400 to 1200° C. using metal-organic chemical vapor deposition techniques, and subsequently controlling the operation temperature to greater than 900° C. so as to permit growth of the islands into the buttresses.

22. The method of claim 21, further comprising forming an inhibiting layer, which is made from a material with a lattice constant mismatched with that of the base layer, on the islands of the GaN-based semiconductor material prior to the growth of the islands into the buttresses under the operation temperature greater than 900° C.

23. The method of claim 4, wherein the wet etching operation is conducted using an etching solution selected from the group consisting of HCl, $H_3PO_4$, and mixtures of HCl and $HNO_3$.

24. The method of claim 1, wherein destroying of the buttresses in step (e) is conducted by a process that combines wet etching techniques and laser beam techniques.

* * * * *